(12) United States Patent
Morita et al.

(10) Patent No.: US 10,779,403 B2
(45) Date of Patent: Sep. 15, 2020

(54) SHORTING PATTERN BETWEEN PADS OF A CAMERA MODULE

(71) Applicant: Apple Inc., Cupertino, CA (US)

(72) Inventors: Masahito Morita, Yokohama (JP); Steven Webster, Singapore (SG)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 16/136,315

(22) Filed: Sep. 20, 2018

(65) Prior Publication Data

US 2020/0100359 A1    Mar. 26, 2020

(51) Int. Cl.
| | | |
|---|---|---|
| *H05K 1/02* | (2006.01) |
| *H05K 1/18* | (2006.01) |
| *H05K 1/11* | (2006.01) |
| *H05K 3/34* | (2006.01) |
| *H04N 5/225* | (2006.01) |
| *H05K 3/30* | (2006.01) |

(52) U.S. Cl.
CPC ......... *H05K 1/0296* (2013.01); *H04N 5/2251* (2013.01); *H05K 1/111* (2013.01); *H05K 1/181* (2013.01); *H05K 3/301* (2013.01); *H05K 3/34* (2013.01); *H05K 2201/10121* (2013.01)

(58) Field of Classification Search
CPC ....... H05K 1/0296; H05K 1/111; H05K 3/301
See application file for complete search history.

(56) References Cited

U.S. PATENT DOCUMENTS

| | | | |
|---|---|---|---|
| 6,298,551 B1 | 10/2001 | Wojnarowski et al. | |
| 6,715,688 B2* | 4/2004 | Kobayashi | G06K 19/07749 |
| | | | 235/441 |
| 7,626,548 B2* | 12/2009 | Matsushita | G06K 19/0775 |
| | | | 343/700 MS |
| 7,980,477 B2* | 7/2011 | Finn | G06K 19/077 |
| | | | 235/492 |
| 2005/0101164 A1 | 5/2005 | Rathbun | |
| 2007/0228547 A1 | 10/2007 | Silverbrook | |
| 2009/0236134 A1* | 9/2009 | Knecht | H01P 7/082 |
| | | | 174/260 |
| 2011/0177839 A1 | 7/2011 | Baliarda et al. | |
| 2015/0380355 A1 | 12/2015 | Rogers et al. | |
| 2018/0076527 A1* | 3/2018 | Chen | H01Q 1/36 |
| 2019/0146319 A1* | 5/2019 | Stapleton | G03B 21/2033 |
| | | | 372/50.124 |

\* cited by examiner

*Primary Examiner* — Binh B Tran
*Assistant Examiner* — Hiram E Gonzalez
(74) *Attorney, Agent, or Firm* — Kligler & Associates Patent Attorneys Ltd

(57) ABSTRACT

An apparatus includes a substrate, a first conductive pad and a second conductive pad, both disposed on the substrate, an electrically conductive trace, and a fusible alloy layer. The electrically conductive trace is laid out between the first and second pads, and is configured to conduct electrical current between the first and second pads, and has a serpentine pattern having multiple bends. The fusible alloy layer is disposed on the first pad and over a portion of the trace including no more than a predefined number of the bends.

14 Claims, 2 Drawing Sheets

SHORTING PATTERN BETWEEN PADS OF A CAMERA MODULE

TECHNICAL FIELD

Embodiments described herein relate generally to circuit manufacturing, and particularly to layout techniques for controlling the flow of fusible alloy on a substrate during manufacturing.

BACKGROUND

Various types of electronic assemblies are designed to minimize footprint and to reduce electrical resistance between a substrate and electronic devices mounted thereon.

SUMMARY

An embodiment that is described herein provides an apparatus that includes a substrate, a first conductive pad and a second conductive pad, both disposed on the substrate, an electrically conductive trace, and a fusible alloy layer. The electrically conductive trace is laid out between the first and second pads, and is configured to conduct electrical current between the first and second pads, and has a serpentine pattern having multiple bends. The fusible alloy layer is disposed on the first pad and over a portion of the trace including no more than a predefined number of the bends.

In some embodiments, the fusible alloy is configured to maintain physical contact with a surface of the electrically conductive trace and is further configured not to maintain contact with material located between the bends. In other embodiments, the material includes a surface of the substrate. In yet other embodiments, the fusible alloy is configured to retain a portion thereof on the first pad.

In an embodiment, the fusible alloy includes a braze alloy. In another embodiment, the fusible alloy includes a solder alloy. In yet another embodiment, the first conductive pad surrounds the second conductive pad.

In some embodiments, the electrically conductive trace is laid out between a first edge of the first pad and a second edge of the second pad. In other embodiments, the first and second edges are facing one another. In yet other embodiments, the first and second edges are not facing one another.

In an embodiments, the fusible alloy layer is configured to flow between the first pad and the electrically conductive trace. In another embodiment, the apparatus includes a device coupled to the second pad.

In some embodiments, the device includes a high-power vertical-cavity surface-emitting laser (VCSEL). In other embodiments, the device includes an image sensor.

There is additionally provided, in accordance with an embodiment that is described herein, a method for producing an optoelectronic assembly, the method includes disposing on a substrate a first conductive pad and a second conductive pad. An electrically conductive trace for conducting electrical current between the first and second pads is laid out between the first and second pads. The electrically conductive trace has a serpentine pattern having multiple bends. A fusible alloy layer is disposed on the first pad and over a portion of the trace including no more than a predefined number of the bends.

There is further provided, in accordance with an embodiment that is described herein, a camera module that includes an optoelectronic assembly and optics assembly. The optoelectronic assembly includes a substrate, a first conductive pad and a second conductive pad, both disposed on the substrate, an electrically conductive trace, which is laid out between the first and second pads, is configured to conduct electrical current between the first and second pads, and has a serpentine pattern having multiple bends, a fusible alloy layer, which is disposed on the first pad and over a portion of the trace including no more than a predefined number of the bends, and a device, which is electrically coupled to at least the second conductive pads and is configured to emit or to receive optical signals. The optics assembly includes an optical path and configured to transfer the optical signals to or from the device.

These and other embodiments will be more fully understood from the following detailed description of the embodiments thereof, taken together with the drawings in which:

DETAILED DESCRIPTION OF EMBODIMENTS

Overview

Figure 1:
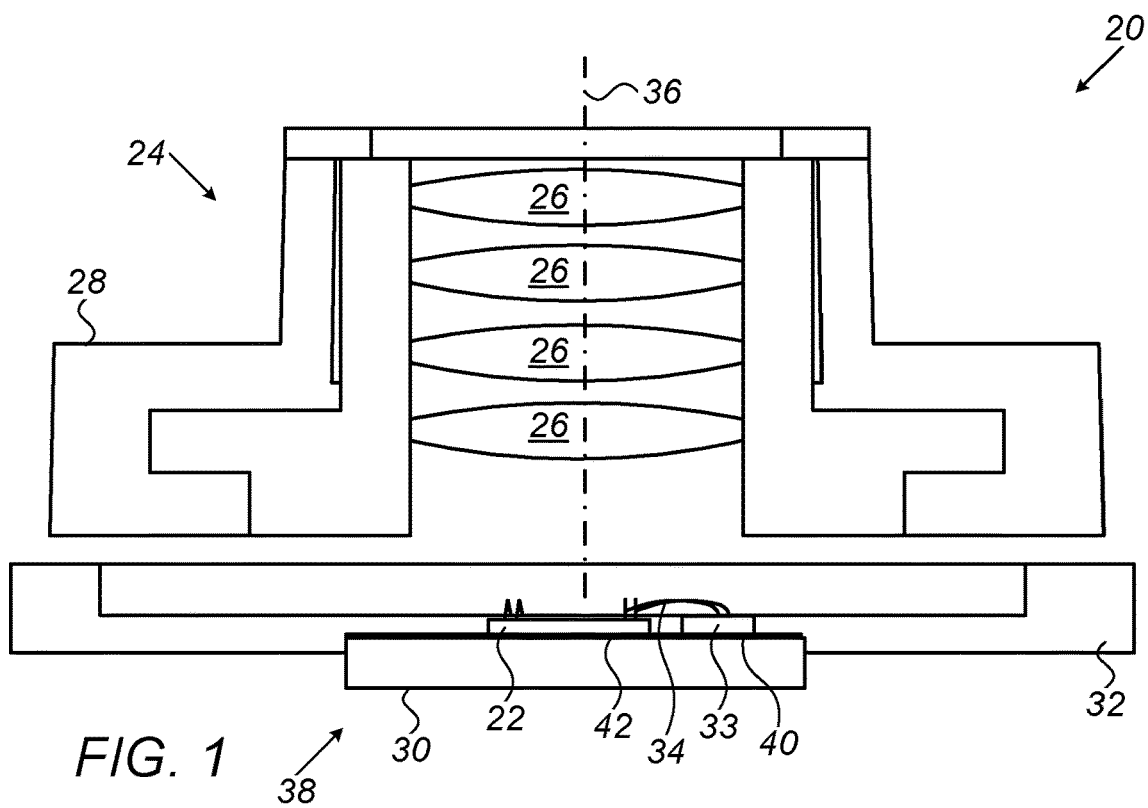
FIG. 1 is a schematic sectional view of a camera module, in accordance with an embodiment that is described herein.

An optoelectronic module, such as a camera module, may comprise multiple devices assembled in a compact package. The devices may exchange signals with one another and with external modules via multiple conductive pads and electrical traces. In some cases, the compact packaging process may result in an electrical failure, such as an undesired electrical short between neighboring pads or between a device and an adjacent structure. For example, due to the increased temperature during a brazing or soldering process, fusible alloy such as braze alloy or solder may flow to undesired locations and may cause undesired electrical short or any other electrical failure.

Embodiments that are described hereinbelow provide improved designs and methods for controlling the flow of fusible alloy over conductive traces, so as to reduce electrical failures in a camera module. The camera module may comprise a frame, which is coupled to a substrate via a first conductive pad, and is configured to exchange electrical signals with a device, such as an image sensor or a light source, coupled to the substrate via a second conductive pad.

In some embodiments, the camera module comprises an electrically conductive trace that is laid out between the first and second pads and is configured to conduct electrical current therebetween. The conductive trace has a serpentine pattern comprising multiple bends.

In an embodiment, the camera module comprises a fusible alloy layer such as a braze alloy, which is disposed on the first pad and over a portion of the trace comprising no more than a predefined number of the bends. Note that in this embodiment, the braze alloy is disposed on a portion of the trace, and does not make physical contact with the second pad or with the device. The serpentine pattern of the conductive trace prevents excess flow of the braze alloy during the brazing process thereby preventing the aforementioned electrical failures.

In an embodiment, the braze alloy is configured to maintain physical contact with the surface of the conductive trace and to prevent physical contact with the surface of the substrate located between the bends. In this embodiment, the braze alloy is configured to retain a predefined portion thereof on the first pad, so as to maintain a specified electrical current between the frame and the first pad.

In some embodiments, the first conductive pad surrounds the second conductive pad, such that the trace is laid out in a margin located between a first edge of the first pad and a second edge of the second pad. In some embodiments, the device comprises an image sensor or a high-power vertical-cavity surface-emitting laser (VCSEL) device, which operates on high electrical currents (e.g., 0.5 mA-20 mA) provided by power source, via the frame, the pads and the trace. The braze material is configured to conduct such high currents, but at high temperatures of the brazing process (e.g., 800° C.) the braze material may flow from the first pad towards the VCSEL. The designed shape and length of the trace prevents undesired short between the first pad and the VCSEL.

The disclosed techniques improve the specified performance of the camera module by controlling the flow of the braze material thereby enabling the use of a high temperature brazing processes. Furthermore, the disclosed techniques increase the reliability of the product comprising the camera module, and simplify the production process of electronic and optoelectronic modules by preventing electrical failures caused by undesired flow of conductive layers.

System Description

FIG. 1 is a schematic sectional view of a camera module 20, in accordance with an embodiment that is described herein. In some embodiments, module 20 comprises an optics assembly 24, which comprises one or more lenses 26 arranged in a housing 28, such as a lens barrel or a lens assembly frame. In some embodiments, camera module 20 may comprise additional components and mechanisms (not shown) such as but not limited to a control circuit for controlling one or more motors and/or linear actuators configured to move lenses 26 (e.g., within housing 28) relative to one another along an optical axis 36. Movement of the lenses is required for various operations, such as focus, zoom, and optical image stabilization. Optics assembly 24, is configured to transfer optical signals between elements of the camera module that are described herein, and is further configured to set an optical path arranged based on the relative position of lenses 26.

In some embodiments, camera module 20 comprises an optoelectronic assembly 38 mounted on a frame 32, which is coupled, directly or indirectly, to optics assembly 24.

In some embodiments, optoelectronic assembly 38 comprises multiple devices, such as one or more image sensors configured to receive optical beams passing through optics assembly 24. In some embodiments, one or more light sources (not shown), such as a vertical-cavity surface-emitting laser (VCSEL), are configured to produce and direct optical beams through optics assembly 24. Assembly 38 may further comprise other devices such as a processor, as well as controlling and interfacing devices (not shown). In the example of FIG. 1, a device 22 that comprises, for example, one of the devices described above, is coupled to a substrate 30 via an electrically conductive die attach pad 42.

In an embodiment, device 22 is electrically coupled to a frame 33 using any suitable process, such as a wire bonding process that produces electrical wires 34 that are configured to conduct electrical current between device 22 and frame 33. Additionally or alternatively, device 22 and frame 33 may be electrically interconnected using any other suitable technique, such as using a flip chip.

In some embodiments, frame 33 is electrically connected to a power source (not shown), and is configured to supply electrical current to operate device 22, e.g., a VCSEL described above. Frame 33 may also conduct electrical signals between assembly 38 and other devices and/or modules. For example, device 22 may comprise the aforementioned image sensor, and frame 33 may conduct electrical signals produced by the image sensor to a processor e.g., for producing an image based on the signals received from the image sensor.

In some embodiments, wires 34 may conduct one type of electrical signals between device 22 and frame 33, and other electrically conductive elements described below are configured to conduct the same type of signals, or another type of electrical signals between pads 40 and 42.

In some embodiments, substrate 30 and frame 33 are coupled to one another via an electrically conductive brazing pad 40 or using any other suitable type of pad.

Additional embodiments of optoelectronic assembly 38 are described in detail in FIGS. 2, 3A and 3B below.

Controlling the Flow of a Braze Alloy Using a Shorting Pattern

Figure 2:
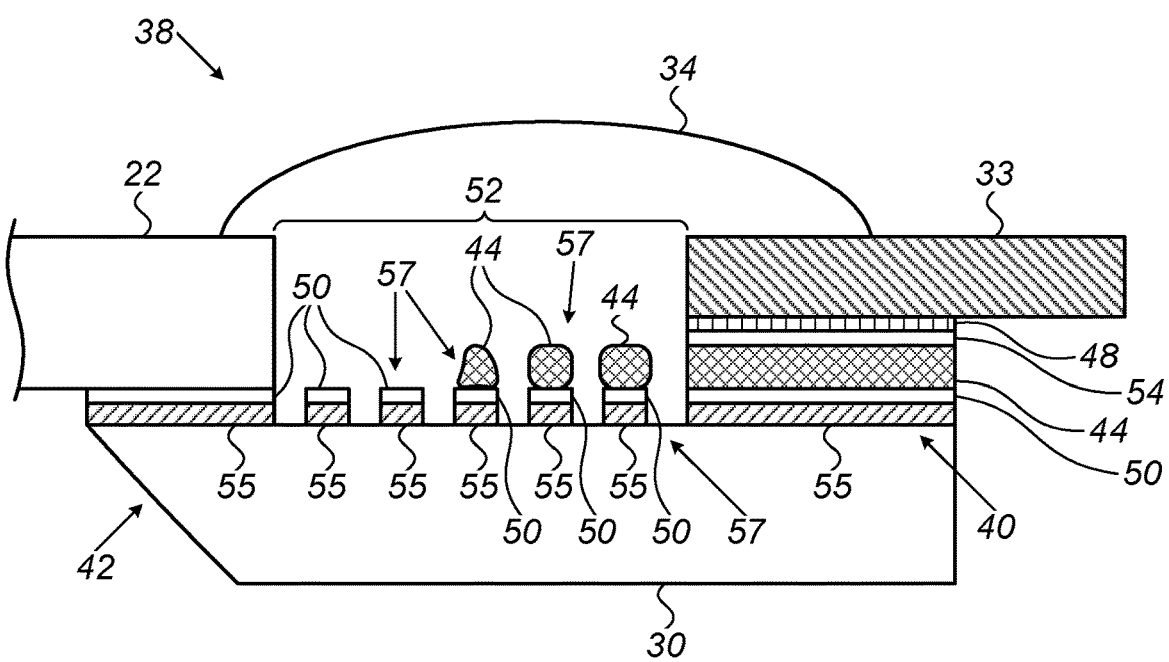
FIG. 2 is a schematic sectional view of an optoelectronic assembly of a camera module, in accordance with an embodiment that is described herein.

FIG. 2 is a schematic sectional view of optoelectronic assembly 38 of camera module 20, in accordance with an embodiment that is described herein. FIG. 2 is a BB sectional view of FIG. 3A, which depicts a top view of pads 40 and 42 of assembly 38 and is described below. In some embodiments, substrate 30 is typically made from any suitable ceramic material, e.g., aluminum nitride (AlN), also referred to herein as "base AlN."

In some embodiments, optoelectronic assembly 38 may comprise a tungsten metallization layer 55 deposited on substrate 30, and a nickel plating layer 50 stacked on tungsten metallization layer 55. In some embodiments, at least one of layers 50 and 55 is configured to conduct electrical current between pads 40 and 42.

In the context of the embodiments that are described herein and in the claims, the terms "disposed," "deposited," and "applied to" are used interchangeably and refer to any suitable method for producing one or more layer on a substrate and/or on another layer.

In other embodiments, metallization layer 55 may comprise tungsten (as described above) or any other suitable metallization elements and/or alloys such as but not limited to molybdenum, copper, silver, silver-palladium alloys, titanium-nickel-copper alloys, titanium-molybdenum-copper alloys, and titanium-palladium-copper alloys. The metallization layer may be produced using a screen printing process, or any other suitable process, such as sputtering, and may have a typical thickness within a range of 5 μm-15 μm. Nickel layer 50 may be produced using any suitable electroless plating or electrolytic plating process, such as bath plating, and having a typical thickness within an exemplary range of 1 μm-10 μm. The thickness ranges described above are exemplary ranges, and in other embodiments, at least one of layers 50 and 55 may have any other suitable thickness.

In some embodiments, any suitable process such as a firing process, may be used for bonding between layers 50 and 55 and between layer 55 and substrate 30.

In some embodiments shown in FIG. 2, layers 50 and 55 of optoelectronic assembly 38 may comprises at least three sections patterned using a screen printing process or any other suitable patterning process. A first section comprises device 22 mounted on die attach pad 42, a second section comprises multiple layers that are stacked on brazing pad 40 and are depicted in detail below, and a third section comprising an electrically conductive trace, referred to herein as a shorting pattern 52, which is laid out between pads 40 and 42 using various configurations shown, for example, in FIGS. 3A and 3B below.

In some embodiments, shorting pattern 52 may have a serpentine shape comprising multiple bends 57. In the context of the present invention and in the claims, the term "bend" refers to a section of the trace of shorting pattern 52, which is laid out in a one dimensional (1D) or two-dimensional (2D) pattern, and is coupled to one or more neighbor bends 57, and/or to at least one of pads 40 and 42. Some configurations of shorting pattern 52 are shown in top view in FIGS. 3A and 3B below.

In some embodiments, optoelectronic assembly 38 comprises a fusible alloy, such as a braze layer 44 made from any suitable braze materials of alloys, such as a eutectic alloy of silver and copper (AgCu). Layer 44 may be applied to brazing pad 40 by screen printing or using any other suitable process.

In some embodiments, frame 33, which is typically made from alumina (Al$_2$O$_3$) serves as a substrate in a process sequence for producing a stack of layers comprising a tungsten metallization layer 48 and a nickel plating layer 54. In some embodiments, tungsten metallization layer 48 is applied to frame 33 and is bonded thereto using deposition and firing processes similar to the processes described for layer 55 above. Subsequently, nickel plating layer 54 is applied to tungsten metallization layer 48 using any of the plating processes described for layer 50 above. Subsequently the stack comprising frame 33 and layers 48 and 54 are flipped and mounted on brazing pad 40, such that nickel plating layer 54 makes physical contact with braze layer 44.

Subsequently, a brazing process is carried out at about 800° C. or at any other suitable temperature that depends on the melting temperature of the braze alloy, so as to produce the eutectic alloy of AgCu and, optionally, for bonding between frame 33 and substrate 30 and all the layers stacked therebetween.

Note that layer 44 is initially disposed over layer 50 typically within the limits of brazing pad 40, but is flowing due to the high temperature (e.g., 800° C.) of the brazing process described above. In some embodiments, after the brazing process, layer 44 is disposed over brazing pad 40 and over a portion of shorting pattern 52. As shown in FIG. 2, layer 44 is disposed over no more than a predefined number of bends 57. In other embodiments, layer 44 may be initially disposed on the surface of a portion of shorting pattern 52.

In some embodiments, shorting pattern 52 enables the flow of layer 44 along bends 57 during the brazing process or any other thermal process carried out after applying layer 44. However, the long serpentine-shaped pattern of shorting pattern 52, prevents layer 44 from flowing into die attach pad 42 or to make physical contact with device 22. Note that the braze material (e.g., AgCu) of layer 44 does not wet over (in other words cannot maintain physical contact with) the aluminum nitride material of substrate 30, and therefore cannot flow beyond the pattern of layers 50 and 54. In these embodiments, a limited portion of layer 44 can flow out of brazing pad 40, thereby maintaining an even volume of the braze material within the area of brazing pad 40.

In some embodiments, the shape of the trace allows dual use of shorting pattern 52: (a) as a conductive trace between pads 42 and 40, and (b) as a barrier between layer 44 and at least one of device 22 and pad 42. This configuration reduces the need to produce a dedicated physical barrier, thus, simplifying the production process of assembly 38. Moreover, this configuration increases the flexibility of the production process and may further increase the production yields by enabling any suitable brazing or soldering process, at any desired process temperature and any amount of braze or solder materials, without risking overflow of the conductive braze or solder material and undesired electrical failures, such as shorts, due to the aforementioned overflow.

Subsequently, device 22 is coupled to die attach pad 42 and wires 34 are formed between frame 33 and device 22 so as to electrically connect therebetween.

In other embodiments, substrate 30 is made from any other suitable ceramic material, such as alumina and alumina coat, or from a low temperature co-fired ceramic (LTCC) and LTCC coat typically made from a multi-layered glass ceramic substrate co-fired with low resistance metal conductors. In alternative embodiments, substrate 30 is made from any other suitable material other than ceramic. In yet other embodiments, substrate 30 may comprise any material, and is coated with one or more layers, such that the top surface of the upper layer cannot maintain physical contact with layer 44.

In alternative embodiments, any other stack of layers and materials may be used in addition to or instead of layers 55 and 50. For example, a stack comprising a molybdenum metallization layer and a nickel plating layer, and/or a stack comprising a layer made from an alloy of titanium copper and a nickel plating layer, and/or a stack comprising a layer made from an alloy of titanium molybdenum and an intermediate copper layer and a nickel plating layer, and/or any other suitable arrangement of one or more layers.

In other embodiments, any suitable solder alloy or a eutectic alloy of solder materials may be used in layer 44, instead of the AgCu alloy. For example, a gold-tin (AuSn) alloy, a gold-germanium (AgGe) alloy, a tin-lead (SnPb) alloy, and a tin-silver-copper (SnAgCu) alloy.

This particular configuration of optoelectronic assembly 38 is shown by way of example, in order to illustrate certain problems that are addressed by embodiments of the present invention and to demonstrate the application of these embodiments in enhancing the performance of such an assembly in a camera module such as module 20. Embodiments of the present invention, however, are by no means limited to this specific sort of example assembly and process sequence, and the principles described herein may similarly be applied to other sorts of optoelectronic assemblies and camera modules and to the production processes thereof.

Figure 3B:
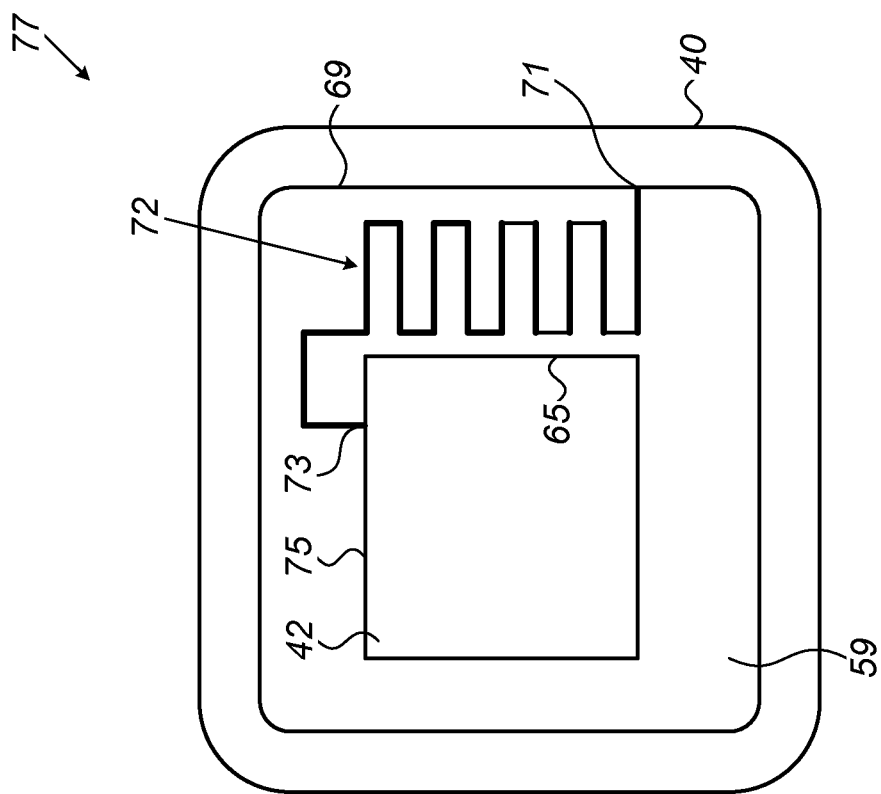
FIGS. 3A and 3B are schematic pictorial illustrations of pads of an optoelectronic assembly of a camera module, in accordance with embodiments that is described herein.
Figure 3A:
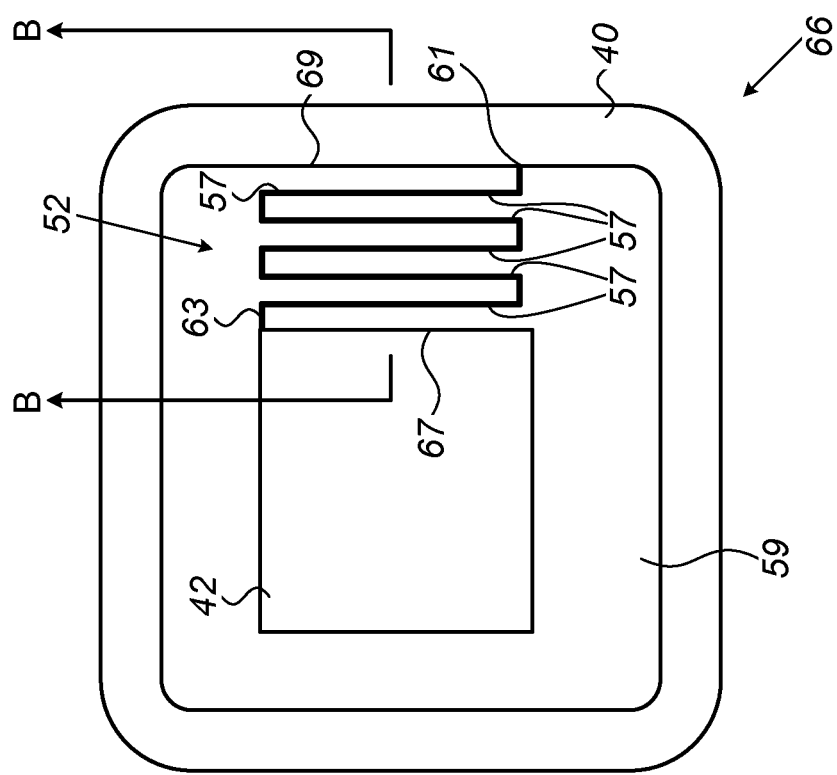

FIG. 3A is a schematic pictorial illustration of a pad section 66 of optoelectronic assembly 38, in accordance with an embodiment that is described herein. Pad section 66 shows a top view of pads 40 and 42 of optoelectronic assembly 38, such that FIG. 2 is a BB sectional view shown in FIG. 3A, but FIG. 2 also comprises layers and devices coupled to pads 40 and 42.

In the example of FIG. 3A, brazing pad 40 appears as a frame surrounding die attach pad 42 and shorting pattern 52 appears as a serpentine connecting between brazing pad 40 and die attached pad 42. During the brazing process the braze material of layer 44 flows from brazing pad 40, through a coupling point 61 into one or more bends 57 of shorting pattern 52. Note that due to the layout of shorting pattern 52, the braze material of layer 44 cannot flow through the entire length of shorting pattern 52, and therefore, cannot make physical contact with pad 42 or with device 22 (shown in FIG. 2).

Note that an area 59 located between pads 40 and 42 is the surface of substrate 30, which is made from aluminum nitride that cannot wet over layer 44. Therefore, the brazing material of layer 44 cannot flow between bends 57 of shorting pattern 52, as described in FIG. 2 above.

In the example of FIG. 3A the ends of shorting pattern 52 are connected to pads 40 and 42 at coupling points 61 and 63, respectively. In an embodiment, the entire trace of shorting pattern 52 is located between an edge 69 of pad 40 and an edge 67 of pad 42. In another embodiment, the shorting pattern may be laid out at any other location within area 59.

FIG. 3B is a schematic pictorial illustration of a pad section 77 of an optoelectronic assembly similar to assembly 38, in accordance with another embodiment that is described herein. In some embodiments, pad section 77 comprises a shorting pattern 72 connecting between brazing pad 40 and die attached pad 42.

In some embodiments, shorting pattern 72 has a serpentine shape that differs from the shape of shorting pattern 52 shown in FIG. 3A above. One end of shorting pattern 72 is coupled to pad 40 at coupling point 71 laid out on edge 69. The other end of shorting pattern 72 is coupled to pad 42 at coupling point 73 laid out on an edge 75 of pad 42. The different shapes of shorting patterns 52 and 72 may obtain different lengths therebetween. Note that in FIG. 3A the ends of the shorting pattern are coupled to edges that are facing one another, and in FIG. 3B the ends of the shorting pattern are coupled to edges that are not facing one another.

The shapes of shorting patterns 52 and 72 are depicted by way of example and are simplified for the sake of clarity. In other embodiments, the conductive trace between two or more pads may be arranged in any suitable form of a shorting pattern or using any other suitable form or configuration. For example, the optoelectronic assembly may comprise two or more shorting patterns distributed within area 59.

Although the embodiments described herein mainly address camera modules and optoelectronic modules, the methods and systems described herein can also be used in other applications, such as in any electronic module comprising a logic device, a memory device or any suitable device, and/or an optoelectronic module comprising optoelectronic devices, such as one or more light emitting diodes (LEDs), lasers or other suitable devices.

Furthermore, the embodiments described herein can also be used in any apparatus having a die connected to power and/or ground via a ceramic frame.

It will thus be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. Apparatus, comprising:
    a substrate;
    a first conductive pad and a second conductive pad, both disposed on the substrate;
    an electrically conductive trace having a serpentine pattern comprising at least first and second bends, wherein the serpentine pattern is laid out within a margin area located between a first edge of the first pad and a second edge of the second pad, such that a first end of the serpentine pattern ends at the first conductive pad, and a second end of the serpentine pattern ends at the second conductive pad; and
    a fusible alloy layer, which is disposed on the first pad and over the first bend of the serpentine pattern, wherein the serpentine pattern is shaped to prevent the fusible alloy from reaching the second bend and the second pad.

2. The apparatus according to claim 1, wherein the fusible alloy is configured to maintain physical contact with a surface of the electrically conductive trace and is further configured not to maintain contact with material located between the at least first and second bends.

3. The apparatus according to claim 2, wherein the material comprises a surface of the substrate.

4. The apparatus according to claim 1, wherein the fusible alloy is configured to retain a portion thereof on the first pad.

5. The apparatus according to claim 1, wherein the fusible alloy comprises a braze alloy.

6. The apparatus according to claim 1, wherein the fusible alloy comprises a solder alloy.

7. The apparatus according to claim 1, wherein the first conductive pad surrounds the second conductive pad.

8. The apparatus according to claim 1, wherein the first and second edges are facing one another.

9. The apparatus according to claim 1, wherein the first and second edges are not facing one another.

10. The apparatus according to claim 1, wherein the fusible alloy layer is configured to flow between the first pad and the electrically conductive trace.

11. The apparatus according to claim 1, and comprising a device coupled to the second pad.

12. The apparatus according to claim 11, wherein the device comprises a high-power vertical-cavity surface-emitting laser (VCSEL).

13. The apparatus according to claim 11, wherein the device comprises an image sensor.

14. A camera module, comprising:
    an optoelectronic assembly, comprising:
        a substrate;
        a first conductive pad and a second conductive pad, both disposed on the substrate;
        an electrically conductive trace having a serpentine pattern comprising at least first and second bends, wherein the serpentine pattern is laid out within a margin area located between a first edge of the first pad and a second edge of the second pad, such that a first end of the serpentine pattern ends at the first conductive pad, and a second end of the serpentine pattern ends at the second conductive pad;
        a fusible alloy layer, which is disposed on the first pad and over the first bend of the serpentine pattern, wherein the serpentine pattern is shaped to prevent the fusible alloy from reaching the second bend and the second pad; and
    optics assembly, which comprises an optical path, and which is configured to transfer the optical signals to or from the device.

* * * * *